(12) United States Patent  
Liu

(10) Patent No.: US 8,629,038 B2
(45) Date of Patent: Jan. 14, 2014

(54) FINFETS WITH VERTICAL FINS AND METHODS FOR FORMING THE SAME

(75) Inventor: Ming-Chyi Liu, Hisn-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 42 days.

(21) Appl. No.: 13/344,423

(22) Filed: Jan. 5, 2012

(65) Prior Publication Data

US 2013/0175659 A1   Jul. 11, 2013

(51) Int. Cl.
*H01L 21/762* (2006.01)
*H01L 27/10* (2006.01)
*B82Y 99/00* (2011.01)

(52) U.S. Cl.
USPC 438/424; 257/506; 257/E27.07; 257/E21.546; 977/755

(58) Field of Classification Search
USPC ............................................ 257/506; 977/755
See application file for complete search history.

(56) References Cited

U.S. PATENT DOCUMENTS

2013/0175659 A1*   7/2013  Liu ................................. 257/506

* cited by examiner

*Primary Examiner* — Zandra Smith
*Assistant Examiner* — Lawrence Tynes, Jr.
(74) *Attorney, Agent, or Firm* — Slater & Matsil, L.L.P.

(57) ABSTRACT

In a method for forming a device, a (110) silicon substrate is etched to form first trenches in the (110) silicon substrate, wherein remaining portions of the (110) silicon substrate between the first trenches form silicon strips. The sidewalls of the silicon strips have (111) surface orientations. The first trenches are filled with a dielectric material to from Shallow Trench Isolation (STI) regions. The silicon strips are removed to form second trenches between the STI regions. An epitaxy is performed to grow semiconductor strips in the second trenches. Top portions of the STI regions are recessed, and the top portions of the semiconductor strips between removed top portions of the STI regions form semiconductor fins.

19 Claims, 10 Drawing Sheets

FINFETS WITH VERTICAL FINS AND METHODS FOR FORMING THE SAME

BACKGROUND

With the increasing down-scaling of integrated circuits and increasingly demanding requirements to the speed of integrated circuits, transistors need to have higher drive currents with increasingly smaller dimensions. Fin Field-Effect Transistors (FinFETs) were thus developed. In conventional FinFET formation processes, the semiconductor fins may be formed by forming trenches in a silicon substrate, filling the trenches with dielectric materials to form Shallow Trench Isolation (STI) regions, and then recessing the top portions of the STI regions. The silicon substrate portions between the recessed portions of the STI regions thus form semiconductor fins, on which the FinFETs are formed.

The silicon substrate may be a (100) substrate or a (110) substrate. If a (100) substrate is used to form the FinFETs, the resulting fins have rough and slightly slanted sidewall surfaces, and suffer from proximity effects. In addition, the profiles of the fins in pattern-dense regions are different from the profiles of the fins in pattern-sparse regions. On the other hand, if a (110) substrate is used to form the FinFETs, the resulting fins have high-quality and vertical sidewall surfaces. The device performance of the FinFETs based on the (110) substrate, however, may be sacrificed due to the use of the (110) substrate.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Methods for forming semiconductor fins that may be used for forming Fin Field-Effect Transistors (FinFETs) are provided. The intermediate stages in the manufacturing of the semiconductor fins and the FinFETs are illustrated in accordance with embodiments. The variations of the embodiments are discussed. Throughout the various views and illustrative embodiments, like reference numbers are used to designate like elements.

Figure 1:
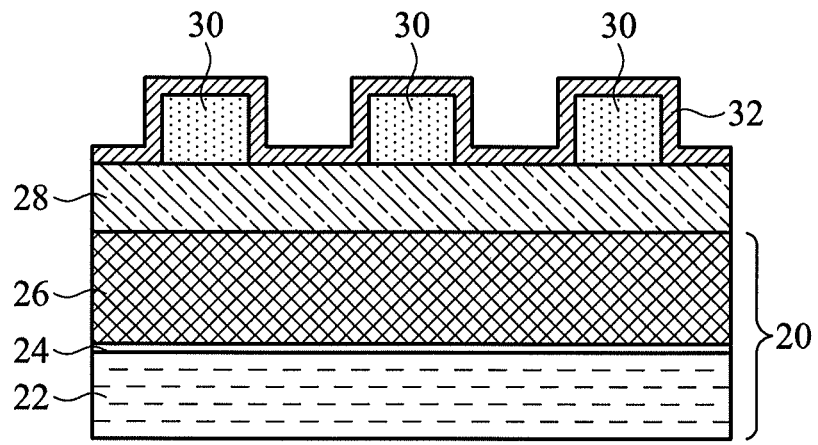
FIGS. 1 through 9 are cross-sectional views of intermediate stages in the manufacturing of semiconductor fins and Fin Field-Effect Transistors (FinFETs) in accordance with some exemplary embodiments.

Referring to FIG. 1, composite semiconductor substrate 20 is provided. Composite semiconductor substrate 20 includes crystalline silicon substrate 22, oxide layer 24 on silicon substrate 22, and crystalline silicon substrate 26 on oxide layer 24. Silicon substrates 22 and 26 are bonded to oxide layer 24. The thickness of oxide layer 24 may be between about 1 Å and about 500 Å, although different thicknesses may be used. One of ordinary skill in the art will realize, however, that the dimensions recited throughout the description are merely examples, and may be changed to different values. Silicon substrate 22 has a (100) surface orientation. Silicon substrate 26 has a (110) surface orientation. Accordingly, silicon substrates 22 and 26 are also referred to as a (100) substrate and a (110) substrate, respectively. Oxide layer 24 may comprise silicon oxide, although other oxides may also be used Hard masks 28 and 30 are formed over silicon substrate 26. In some embodiments, a pad oxide (not shown), which is formed of silicon oxide, is formed between silicon substrate 26 and hard mask 28. Hard masks 28 and 30 may be formed of silicon nitride, silicon oxynitride, silicon carbide, or the like. Hard masks 28 and 30 may be formed of different materials. Accordingly, hard mask 30 is patterned without patterning hard mask 28. Spacer film 32 is then formed on the top surfaces and the sidewalls of hard mask 30, for example, using a conformal deposition method.

Figure 2:
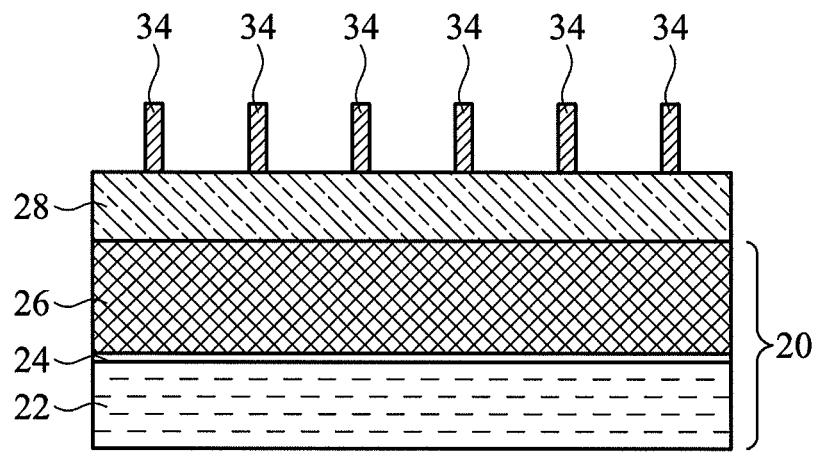

Next, as shown in FIG. 2, the horizontal portions of spacer film 32 are removed, for example, in an etching step. Hard mask 30 is then removed. The remaining vertical portions of spacer film 32 are referred to as spacers 34 hereinafter. By performing the steps shown in FIGS. 1 and 2, the pitch of spacers 34 may be reduced to a half of the pitch of hard mask 30. In alternative embodiments, the step shown in FIG. 1 may be skipped, and spacers 34 are formed directly by a deposition step and a patterning step.

Figure 3:
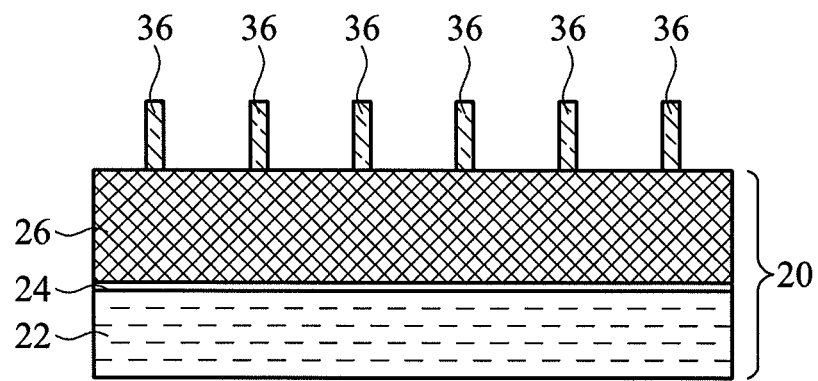

Next, as shown in FIG. 3, spacers 34 are used as an etching mask to etch hard mask 28, so that the patterns of spacers 34 are transferred to hard mask 28, forming hard mask patterns 36. Spacers 34 are then removed.

Figure 4:
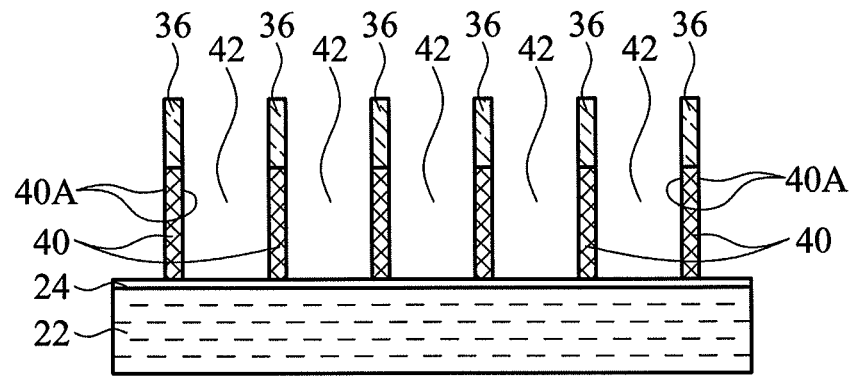

Referring to FIG. 4, hard mask patterns 36 are used to etch through the underlying silicon substrate 26, so that silicon strips 40 and trenches 42 are formed. The etching may be performed using oxide layer 24 as the etching stop layer. Accordingly, after the etching, oxide layer 24 may be exposed through trenches 42 in silicon substrate 26. The lengthwise directions (in the top view of the structures shown in FIGS. 1 through 3) of hard mask 30 and spacers 34 are selected, so that sidewall surfaces 40A of silicon strips 40 have (111) surface orientations. Since (111) surfaces are denser than some other surfaces such as (100) and (110) surfaces, the quality of the sidewalls 40A of silicon strips 40 are smooth. Furthermore, since (111) surfaces are stable surfaces that have a lower etching rate than other surfaces such as (100) and (110) surfaces, sidewall surfaces 40A are vertical, and are perpendicular to the original (110) surface of substrate 26.

Figure 5:
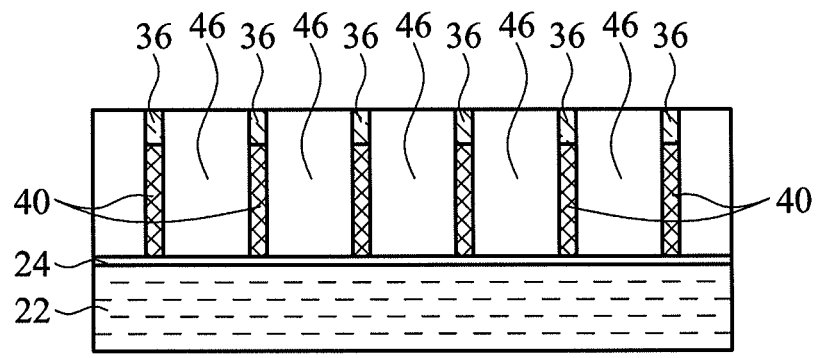
Figure 6:
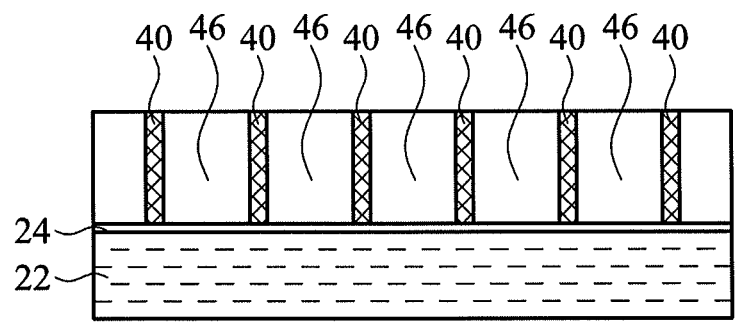

FIG. 5 illustrates the filling of dielectric materials into trenches 42, followed by a Chemical Mechanical Polish (CMP) step to remove excess portions of the dielectric material over hard mask patterns 36. Next, as shown in FIG. 6, hard mask patterns 36 are removed. The pad oxide layer, if any, is also removed. The remaining dielectric materials between silicon strips 40 are referred to as Shallow Trench Isolation (STI) regions 46 hereinafter. STI regions 46 may comprise silicon oxide and/or other dielectric materials. In some embodiments, STI regions 46 and oxide layer 24 are formed of the same material such as silicon oxide. In alternative embodiments, STI regions 46 and oxide layer 24 are formed of different materials. Since STI regions 46 and oxide layer 24 are formed in different steps, the interface between STI regions 46 and oxide layer 24 are visible, and STI regions 46 and oxide layer 24 may be distinguished from each other.

Figure 7:
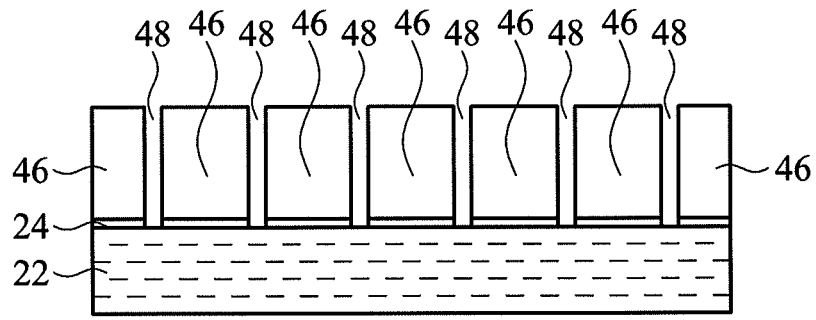
Figure 8:
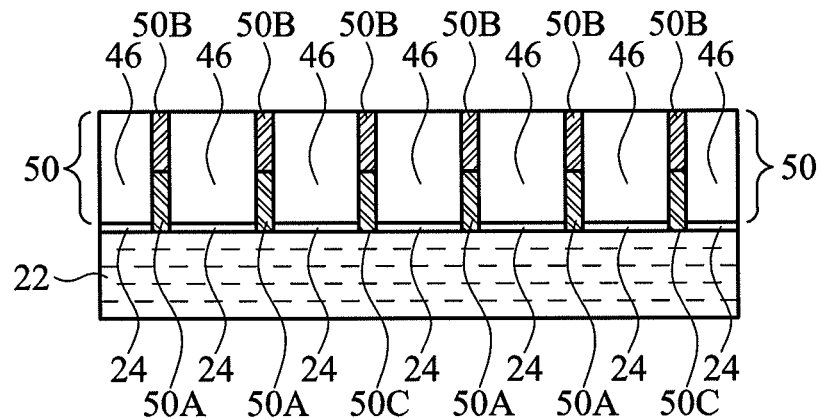

Referring to FIG. 7, silicon strips 40 are removed, forming trenches 48 between STI regions 46. Oxide layer 24 is accordingly exposed through trenches 48. Next, the exposed portions of oxide layer 24 are etched, so that the underlying silicon substrate 22 is exposed through trenches 48. In a subsequent step, as shown in FIG. 8, an epitaxy is performed, so that semiconductor strips 50 are epitaxially grown in trenches 48. Since semiconductor strips 50 are grown from the (100) substrate 22, semiconductor strips 50 have the (100) top surface orientation.

In some exemplary embodiments, semiconductor strips 50 comprise substantially pure silicon. In alternative embodiments, semiconductor strips 50 comprise a non-silicon semiconductor material such as pure or substantially pure germanium, silicon germanium, or a III-V compound semiconductor such as InAs, AlAs, GaAs, InP, GaN, InGaAs, InAlAs, GaSb, AlSb, AlP, GaP, and/or the like. In the embodiments in which semiconductor strips 50 are formed of a non-silicon semiconductor material, semiconductor strips 50 may comprise buffer regions 50A and overlying non-silicon semiconductor regions 50B. Buffer regions 50A may have a lattice constant between the lattice constant of silicon substrate 22 and the lattice constant of non-silicon semiconductor regions 50B, so that the number of defects in non-silicon semiconductor regions 50B is reduced.

After the epitaxy of semiconductor strips 50, STI regions 46 are recessed, so that the top portions (referred to as fins 50' hereinafter) of semiconductor strips 50 are over the top surfaces of the remaining STI regions 46. Semiconductor fins 50' may then be used to form FinFET 100. The formation of the FinFETs may include forming gate dielectric 102 on the top surface and sidewalls of semiconductor fins 50', forming gate electrode 104 over gate dielectric 102, and forming source and drain regions (not in the illustrated plane) on opposite sides of gate electrode 104. The formation details are not discussed herein.

Figure 9:
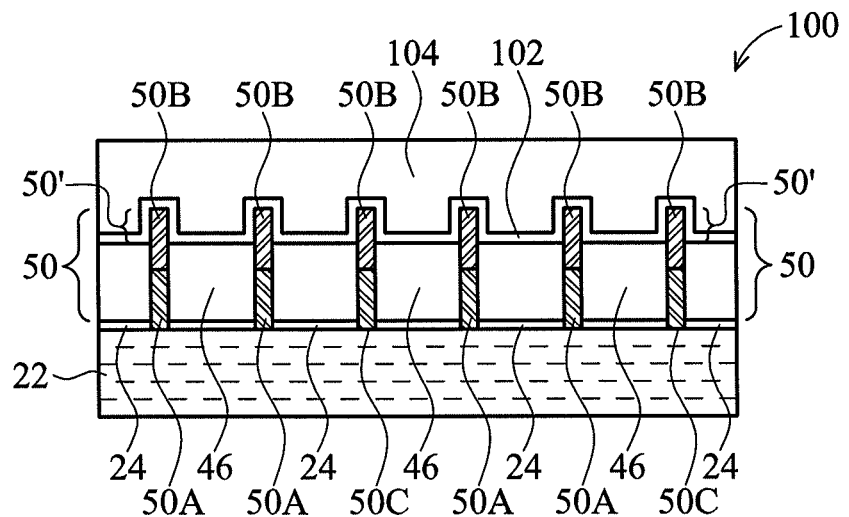

Since oxide layer 24 and STI regions 46 are formed in different process steps, in the structure shown in FIGS. 8 and 9, oxide layer 24 and STI regions 46 have visible interfaces regardless of whether oxide layer 24 and STI regions 46 are formed of the same material or different materials. Accordingly, oxide layer 24 and STI regions 46 can be distinguished from each other. Furthermore, oxide layer 24 is a planar layer, and does not extend to the sidewalls of semiconductor strips 50. Additionally, there may be visible interfaces 50C between semiconductor strips 50 and silicon substrate 22, for example, when silicon substrate 22 and semiconductor strips 50 comprise different materials.

It is observed that since semiconductor strips 50 are formed in the openings left by silicon strips 40 (FIGS. 6 and 7), the sidewall profile of semiconductor strips 50 are substantially the same as the sidewall profile of silicon strips 40. Since silicon strips 40 have (111) surface orientations, the sidewalls are vertical and smooth. The sidewalls of semiconductor strips 50 are thus also vertical and smooth. The quality of semiconductor strips 50 and the quality of the resulting FinFETs are thus improved.

FIGS. 10 through 17 illustrate cross-sectional views of intermediate stages in the formation of semiconductor fins and FinFETs in accordance with alternative embodiments. Unless specified otherwise, the materials and formation methods of the components in these embodiments (and the embodiments shown in FIGS. 18 through 30) are essentially the same as the like components, which are denoted by like reference numerals in the embodiment shown in FIGS. 1 through 9. The formation details of the embodiments shown in FIGS. 10 through 30 may thus be found in the discussion of the embodiments shown in FIGS. 1 through 9.

Figure 10:
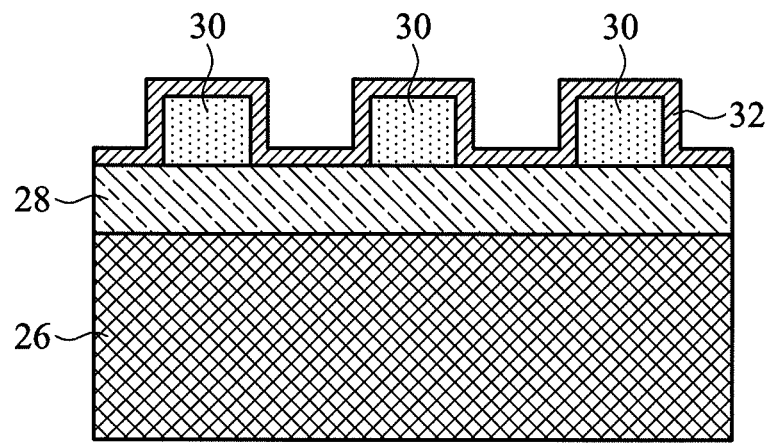
FIG. 10 through 30 illustrate cross-sectional views of intermediate stages in the manufacturing of semiconductor fins and FinFETs in accordance with some alternative exemplary embodiments.
Figure 11:
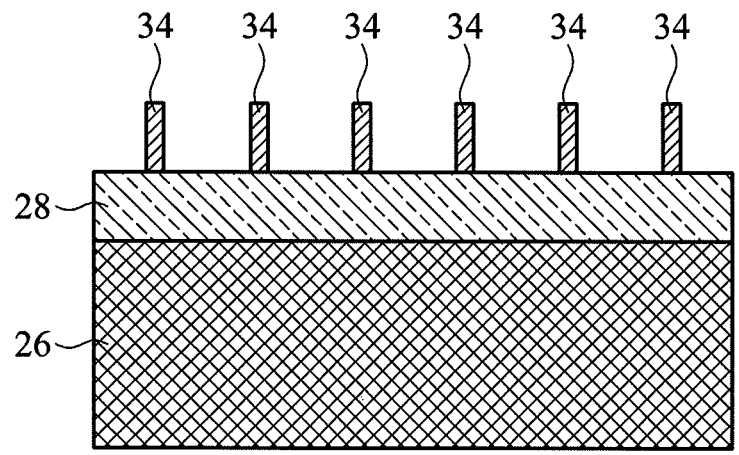
Figure 12:
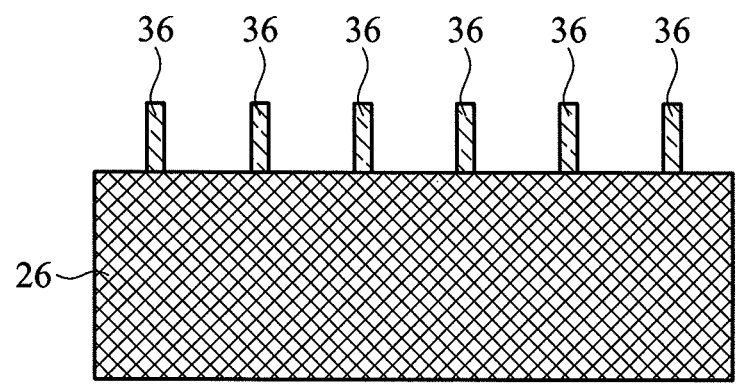

Referring to FIG. 10, silicon substrate 26 is provided, followed by the formation of a pad oxide (not shown), hard mask 28, and hard mask 30. Hard mask 30 is then patterned, and spacer film 32 is formed on the top surface and sidewalls of the patterned hard mask 30. Silicon substrate 26 is a (110) substrate that has a (110) surface orientation. Next, referring to FIG. 11, spacers 34 are formed, which are the remaining portions of spacer film 32 as in FIG. 10. The details for forming spacers 34 are essentially the same as illustrated in FIG. 2, and are not repeated herein. Next, spacers 34 are used as an etching mask to etch hard mask 28. As a result, hard mask patterns 36 as shown in FIG. 12 are formed. Spacers 34 are then removed.

Figure 13:
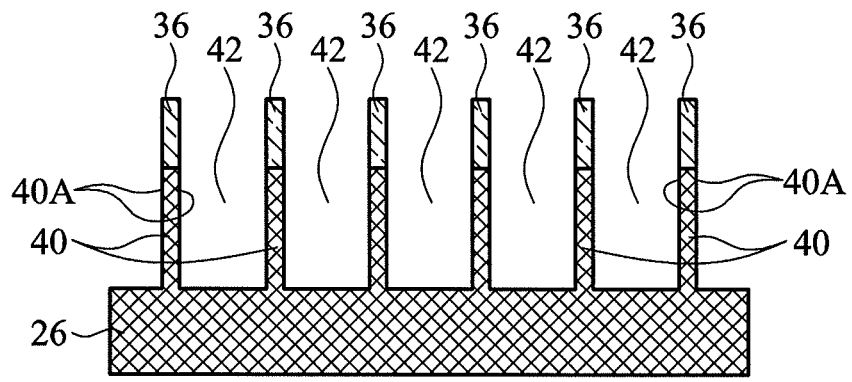

FIG. 13 illustrates the etching of silicon substrate 26, wherein the etching stops at an intermediate level of silicon substrate 26. Accordingly, trenches 42 are formed in silicon substrate 26. The portions of silicon substrate 26 between trenches 42 are silicon strips 40. The lengthwise direction (in the top view of the structure in FIG. 13) of silicon strips 40 are selected, so that sidewalls 40A of silicon strips 40 have (111) surface orientations. As a result, sidewalls 40A are smooth and vertical.

Figure 14:
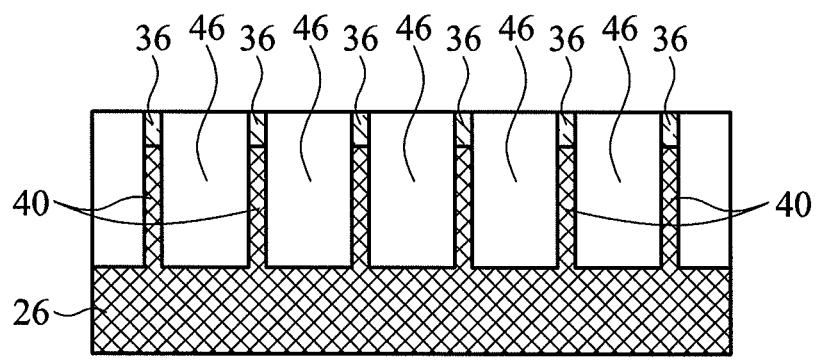
Figure 15:
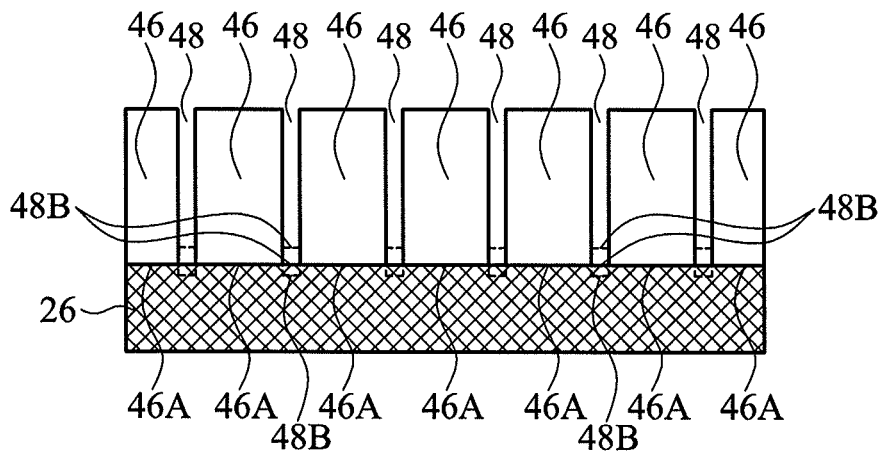

Next, as shown in FIG. 14, STI regions 46 are formed. Silicon strips 40 and the overlying hard mask patterns 36 are then removed by etching, and trenches 48 are formed. The resulting structure is shown in FIG. 15. In some embodiments, the removal of silicon strips 40 is stopped when bottom surface 48B of trenches 48 are level with bottom surfaces 46A of STI regions 46. Alternatively, bottom surfaces 48A may be higher or lower than bottom surfaces 46A of STI regions 46. Dashed lines 48B illustrate the respective bottom surfaces of trenches 48 in accordance with these embodiments.

Figure 16:
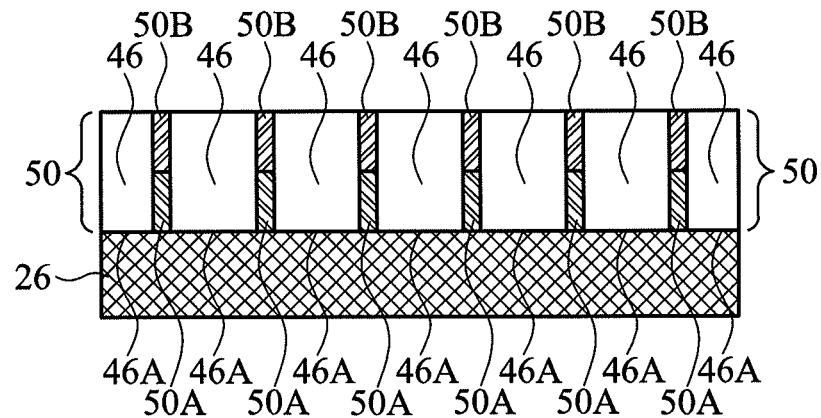
Figure 17:
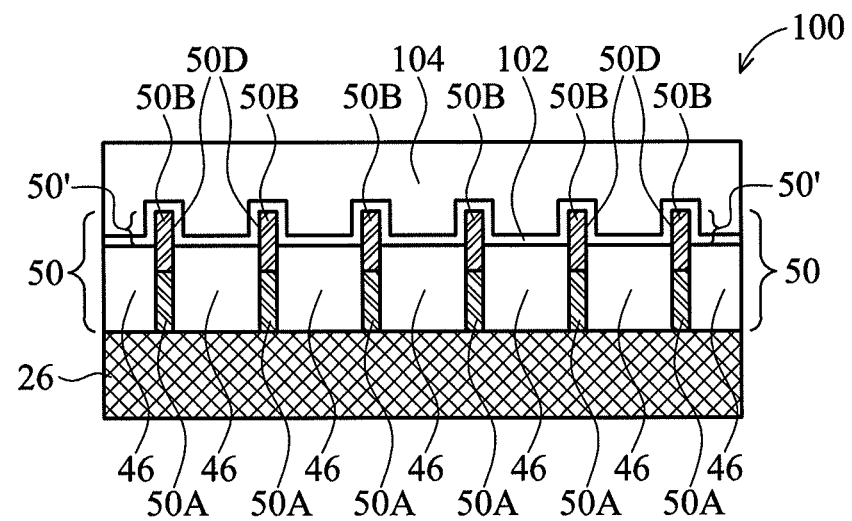
Figure 18:
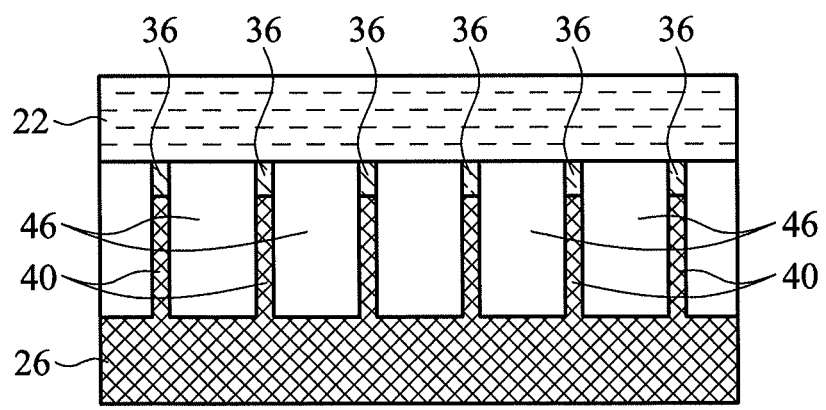

Next, as shown in FIG. 16, semiconductor strips 50 are epitaxially grown in trenches 48, wherein the epitaxy starts from silicon substrate 26 or the remaining portions of silicon strips 40, if any. The bottom surfaces of semiconductor strips 50 may be higher than, level with, or lower than, bottom surfaces 46A of STI regions 46. Similar to the embodiments shown in FIG. 8, semiconductor strips 50 may be formed of silicon or a non-silicon semiconductor material. The candidate materials of semiconductor strips 50 may be essentially the same as in the embodiments shown in FIG. 8. In the subsequent steps, as shown in FIG. 17, STI regions 46 are recessed to form semiconductor fins 50'. FinFET 100 that includes gate dielectric 102 and gate electrode 104 may then be formed on semiconductor fins 50'. In the resulting structure, semiconductor fins 50' and semiconductor strips 50 have sidewalls 50D. Since semiconductor strips 50 are grown from (110) substrate 26, sidewalls 50D also have (111) surface orientations.

FIGS. 18 through 22 illustrate cross-sectional views of intermediate stages in the formation of semiconductor fins and FinFETs in accordance with yet alternative embodiments. The initial steps are essentially the same as in FIGS. 10 through 14. Accordingly, the materials and the process details may refer to the embodiments in FIGS. 10 through 14. Next, as in FIG. 18, silicon substrate 22, which is a (100) substrate, is bonded to STI regions 46. STI regions 46 may be formed of an oxide such as silicon oxide. Accordingly, the bonding may be a fusion bonding.

Figure 19:
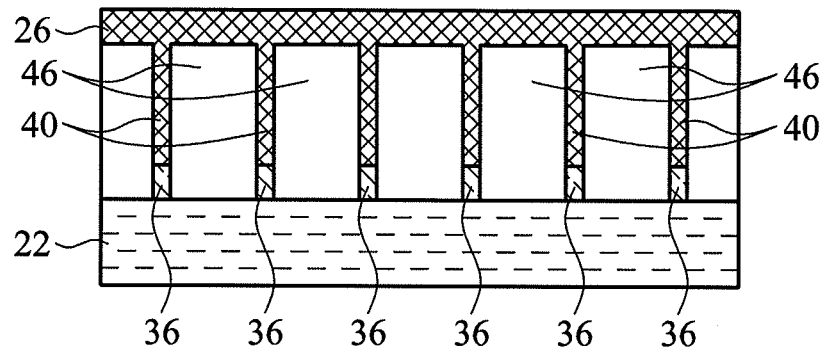
Figure 20:
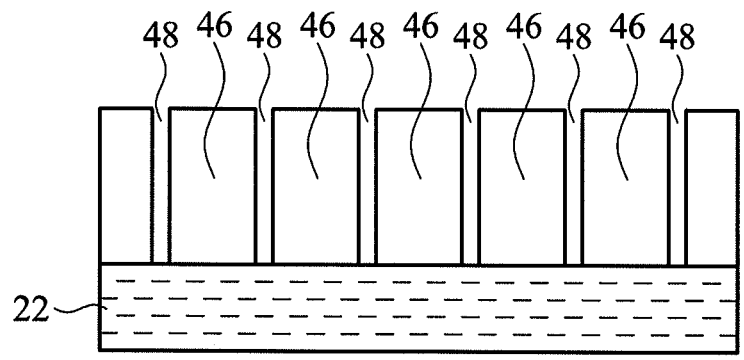

Next, referring to FIG. 19, the original silicon substrate 26 is thinned. In some embodiments, the thinning is performed through grinding, until a very thin silicon substrate 26 is left. In alternative embodiments, the thinning may be performed until STI regions 46 are exposed. Next, as shown in FIG. 20, all remaining portions of silicon substrate 26, including silicon strips 40, are removed. The remaining portions of hard mask patterns 36 as shown in FIG. 19 are also removed through an etching step, forming trenches 48 between STI regions 46.

Figure 21:
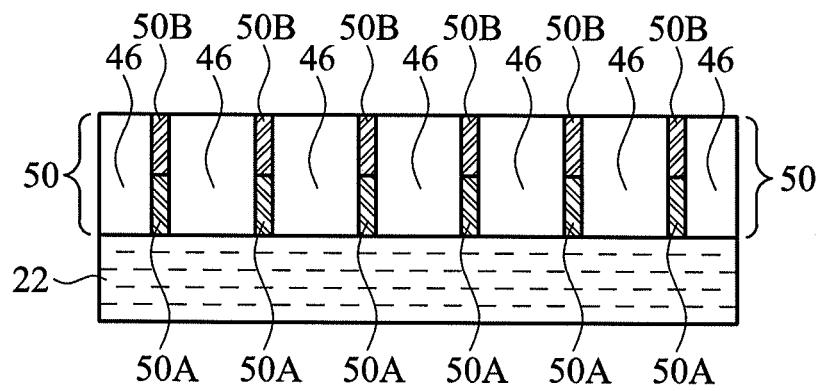
Figure 22:
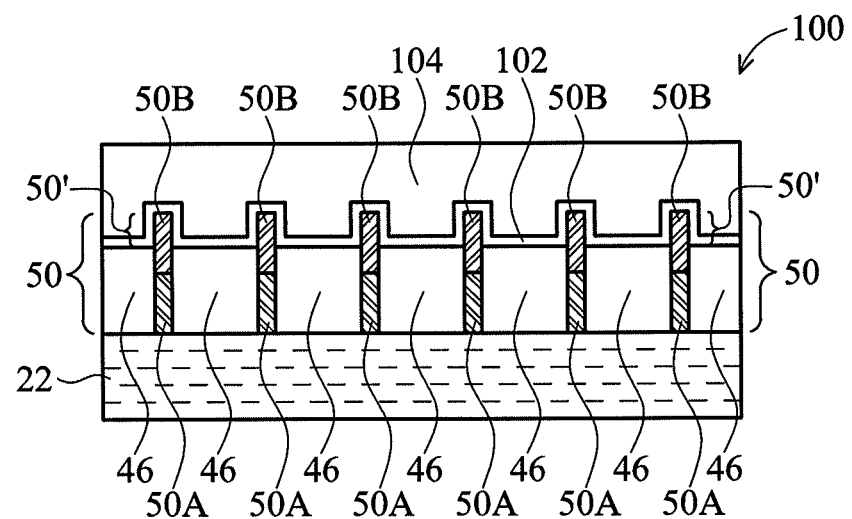

In FIG. 21, semiconductor strips 50, which may be silicon strips or non-silicon strips, are formed in trenches 48 through an epitaxy. FIG. 22 illustrates the formation of semiconductor fins 50' through the recessing of STI regions 46. FinFET 100 including gate dielectric 102 and gate electrode 104 may then be formed on semiconductor fins 50'. Since semiconductor strips 50 are grown from the (100) substrate 22, semiconductor strips 50 and semiconductor fins 50' have the (100) top surface orientation.

Figure 23:
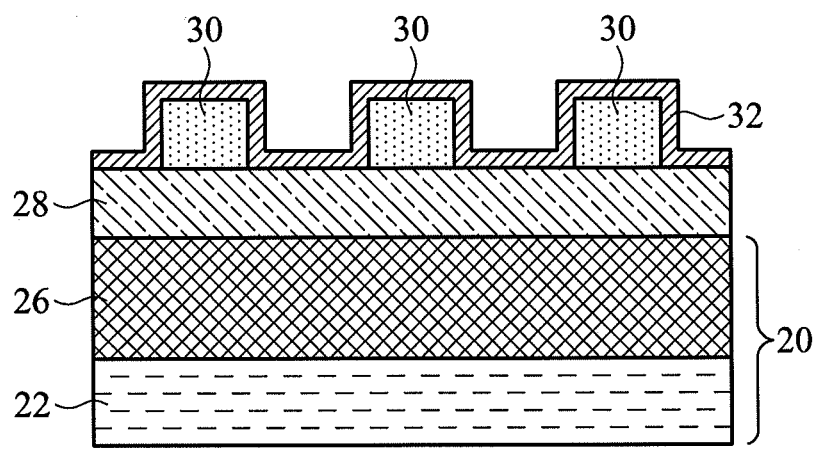
Figure 24:
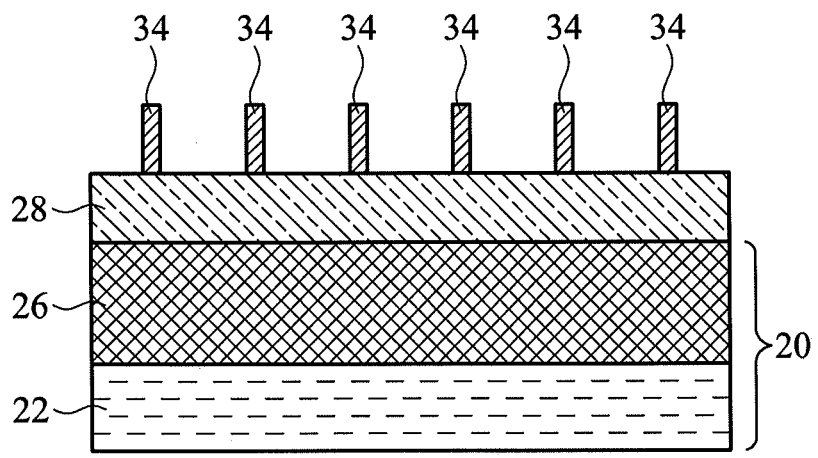
Figure 25:
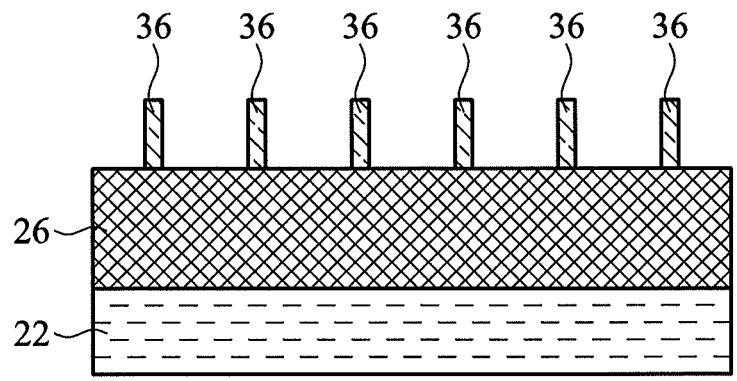
Figure 26:
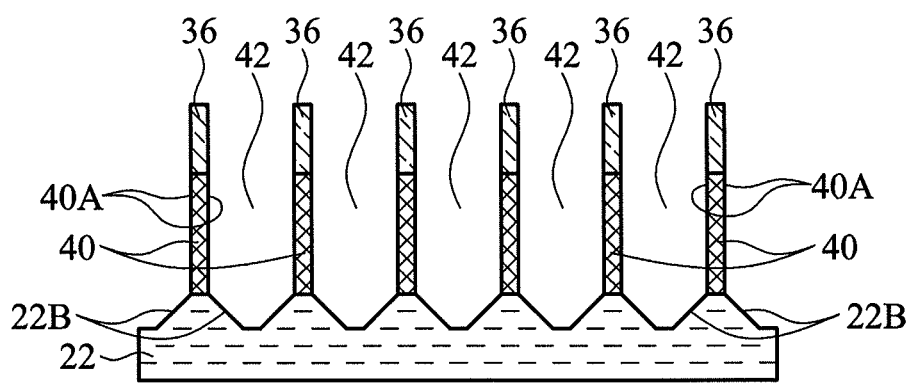

FIGS. 23 through 30 illustrate cross-sectional views of intermediate stages in the formation of semiconductor fins in accordance with yet alternative embodiments. These embodiments are similar to the embodiments shown in FIGS. 1 through 7, except that composite semiconductor substrate 20 does not include an oxide layer between silicon substrates 22 and 26. As shown in FIGS. 23 through 25, a plurality of process steps (which are essentially the same as in FIGS. 1 through 3) are performed, and hard mask patterns 36 as in FIG. 25 are formed. Silicon substrates 22 and 26 are a (100) substrate and a (110) substrate, respectively, and are bonded to each other. There may be no other layer between silicon substrates 22 and 26. Next, as shown in FIG. 26, substrate 26 is etched to form silicon strips 40 and trenches 42. Again, sidewalls 40A of silicon strips 40 have (111) surface orientations. The etching is performed until silicon substrate 22 is exposed through trenches 42. In some embodiments, trenches 42 extend into silicon substrate 22. As a result, slanted facets 22B are formed in silicon substrate 22.

Figure 27:
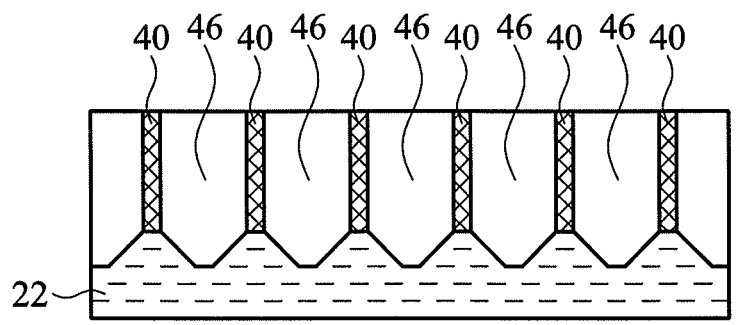
Figure 28:
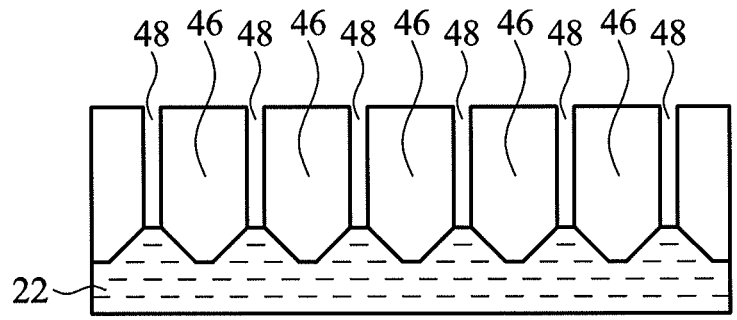
Figure 29:
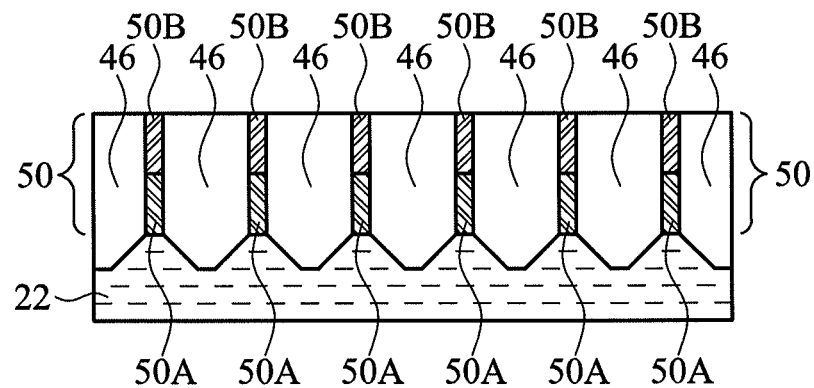
Figure 30:
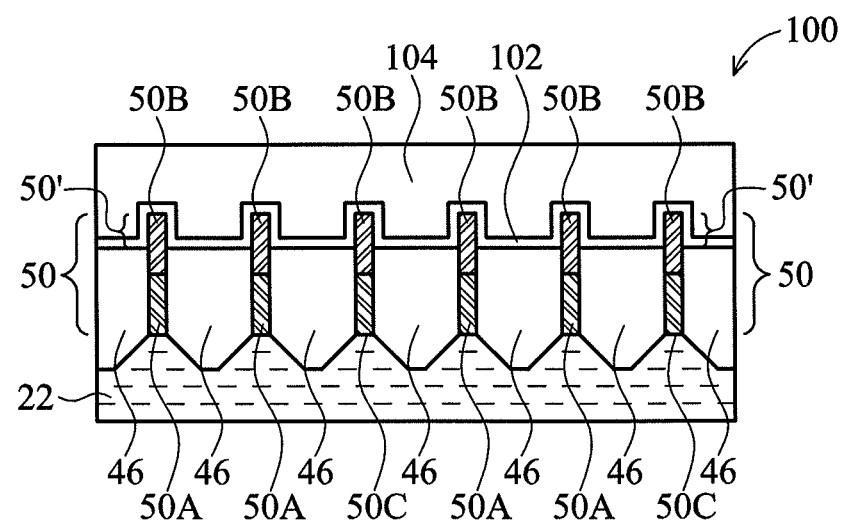

Next, referring to FIG. 27, STI regions 46 are formed in trenches 42, followed by the removal of hard mask patterns 36. In FIG. 28, silicon strips 40 are removed in an etching step, and hence trenches 48 are formed between STI regions 46. After the removal of silicon strips 40, silicon substrate 22 is exposed through trenches 48. Next, as shown in FIG. 29, semiconductor strips 50, which may be silicon strips or non-silicon semiconductor strips, are formed. FIG. 30 illustrates the formation of semiconductor fins 50' through the recessing of STI regions 46. FinFET 100 including gate dielectric 102 and gate electrode 104 may then be formed on semiconductor fins 50'.

In the embodiments, the semiconductor fins are formed starting from (110) substrates, and the sidewall surfaces of the semiconductor fins have essentially the same profile and quality as that of (111) silicon surfaces. In these embodiments, the silicon fins having the (111) surfaces and formed from (110) substrates act as the molds, and the non-silicon fins or the (100) silicon fins are formed from the molds. Accordingly, the quality of the resulting semiconductor fins is improved.

In accordance with embodiments, a (110) silicon substrate is etched to form first trenches in the (110) silicon substrate, wherein remaining portions of the (110) silicon substrate between the first trenches form silicon strips. The sidewalls of the silicon strips have (111) surface orientations. The first trenches are filled with a dielectric material to from Shallow Trench Isolation (STI) regions. The silicon strips are removed to form second trenches between the STI regions. An epitaxy is performed to grow semiconductor strips in the second trenches. Top portions of the STI regions are recessed, and the top portions of the semiconductor strips between removed top portions of the STI regions form semiconductor fins.

In accordance with other embodiments, a method includes providing a composite substrate, which includes a (100) silicon substrate, an oxide layer over and bonded to the (100) silicon substrate; and a (110) silicon substrate over and bonded to the oxide layer. The (110) silicon substrate is etched to form first trenches in the (110) silicon substrate, wherein remaining portions of the (110) silicon substrate between the first trenches form silicon strips. During the etching step, the oxide layer is used as an etch stop layer. The first trenches are filled with a dielectric material to from STI regions in the first trenches. The silicon strips are removed to form second trenches between the STI regions, and the oxide layer is exposed through the second trenches. The portions of the oxide layer exposed through the second trenches are removed, so that the (110) silicon substrate is exposed through the second trenches. An epitaxy is performed to grow semiconductor strips in the second trenches and from (100) silicon.

In accordance with yet other embodiments, a device includes a (100) silicon substrate, a planar oxide layer on a top surface of the (100) silicon substrate, and insulation regions over and contacting the planar oxide layer. The interfaces between the insulation regions and the planar oxide layer are distinguishable, and are substantially planar. A semiconductor strip extends from a top surface of the insulation regions into the insulation regions and the planar oxide layer. A bottom surface of the semiconductor strip contacts the (100) silicon substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    etching a (110) silicon substrate to form first trenches in the (110) silicon substrate, wherein remaining portions of the (110) silicon substrate between the first trenches form silicon strips, and wherein sidewalls of the silicon strips have (111) surface orientations;
    filling the first trenches with a dielectric material to from Shallow Trench Isolation (STI) regions;
    removing the silicon strips to form second trenches between the STI regions;
    performing an epitaxy to grow semiconductor strips in the second trenches; and
    recessing top portions of the STI regions, wherein top portions of the semiconductor strips between removed top portions of the STI regions form semiconductor fins.

2. The method of claim 1, wherein before the step of etching the (110) silicon substrate, a (100) silicon substrate is bonded to the (110) substrate through an oxide layer, and wherein in the step of etching the (110) silicon substrate, the oxide layer is used as an etching stop layer.

3. The method of claim 2 further comprising, before the step of performing the epitaxy, removing portions of the oxide layer exposed through the second trenches to expose the (100) silicon substrate, wherein the semiconductor strips are epitaxially grown from the (100) silicon substrate.

4. The method of claim 1, wherein the step of etching the (110) silicon substrate is stopped when bottoms of the first trenches are at an intermediate level between a top surface and a bottom surface of the (110) silicon substrate, and wherein the semiconductor strips comprise non-silicon semiconductor materials.

5. The method of claim 1 further comprising:
after the STI regions are formed and before the step of removing the silicon strips, bonding a (100) substrate onto the STI regions;
thinning the (110) silicon substrate; and
after the step of bonding the (100) substrate, removing the silicon strips, wherein the (100) silicon substrate is exposed through the second trenches after the step of removing the silicon strips is performed, and wherein the semiconductor strips are epitaxially grown from the (100) substrate.

6. The method of claim 1, wherein a (100) silicon substrate is bonded to the (110) substrate directly, and wherein the step of etching the (110) silicon substrate is stopped when the (100) silicon substrate is exposed.

7. The method of claim 6, wherein the semiconductor strips are epitaxially grown from the (100) silicon substrate.

8. A method comprising:
etching a composite substrate comprising:
a (100) silicon substrate;
an oxide layer over and bonded to the (100) silicon substrate; and
a (110) silicon substrate over and bonded to the oxide layer, wherein after the step of etching, the (110) silicon substrate is etched
to form first trenches in the (110) silicon substrate, wherein remaining portions of the (110) silicon substrate between the first trenches form silicon strips, and wherein the oxide layer is used as an etch stop layer;
filling the first trenches with a dielectric material to from Shallow Trench Isolation (STI) regions in the first trenches;
removing the silicon strips to form second trenches between the STI regions, wherein the oxide layer is exposed through the second trenches;
removing portions of the oxide layer exposed through the second trenches, wherein a top surface of the (100) silicon substrate is exposed through the second trenches; and
performing an epitaxy to grow semiconductor strips in the second trenches, wherein the semiconductor strips are epitaxially grown from (100) silicon.

9. The method of claim 8, wherein sidewalls of the silicon strips have (111) surface orientations.

10. The method of claim 8 further comprising recessing top portions of the STI regions, wherein top portions of the semiconductor strips between the top portions of the STI regions form semiconductor fins.

11. The method of claim 8, wherein the semiconductor strips comprise substantially pure silicon.

12. The method of claim 8, wherein the semiconductor strips comprise a non-silicon semiconductor material.

13. The method of claim 8 further comprising:
before the step of etching the (110) silicon substrate, forming a first hard mask over the (110) silicon substrate;
forming and patterning a second hard mask over the first hard mask;
forming a spacer film on top surface and sidewalls of the patterned second hard mask;
removing horizontal portions of the spacer film and the second hard mask, wherein vertical portions of the spacer film remain to form spacers; and
etching the first hard mask using the spacers as an etching mask, wherein remaining portions of the first hard mask form hard mask patterns, and wherein the step of etching the (110) silicon substrate is performed using the hard mask patterns as an additional etching mask.

14. A method comprising:
etching a (110) silicon substrate to form first trenches in the (110) silicon substrate, until an oxide layer underlying the (110) silicon substrate is exposed, wherein remaining portions of the (110) silicon substrate between the first trenches form silicon strips, and wherein the step of etching is oriented to make sidewalls of the silicon strips to have (111) surface orientations;
filling the first trenches with a dielectric material to from Shallow Trench Isolation (STI) regions in the first trenches;
removing the silicon strips to form second trenches between the STI regions until the oxide layer is exposed through the second trenches;
removing portions of the oxide layer that are exposed through the second trenches, wherein a (100) silicon substrate underlying the oxide layer is exposed through the second trenches; and
performing an epitaxy to grow semiconductor strips in the second trenches.

15. The method of claim 14 further comprising, after the epitaxy, recessing top portions of the STI regions, wherein top portions of the semiconductor strips between the top portions of the STI regions form semiconductor fins.

16. The method of claim 14, wherein the semiconductor strips comprise substantially pure silicon.

17. The method of claim 14, wherein the semiconductor strips comprise a non-silicon semiconductor material.

18. The method of claim 14, wherein before the step of etching the (110) silicon substrate, the (110) silicon substrate, the oxide layer, and the (110) silicon substrate.

19. The method of claim 14 further comprising:
before the step of etching the (110) silicon substrate, forming a first hard mask over the (110) silicon substrate;
forming and patterning a second hard mask over the first hard mask;
forming a spacer film on top surface and sidewalls of the patterned second hard mask;
removing horizontal portions of the spacer film and the second hard mask, wherein vertical portions of the spacer film remain to form spacers; and
etching the first hard mask using the spacers as an etching mask, wherein remaining portions of the first hard mask form hard mask patterns, and wherein the step of etching the (110) silicon substrate is performed using the hard mask patterns as an additional etching mask.

* * * * *

UNITED STATES PATENT AND TRADEMARK OFFICE
CERTIFICATE OF CORRECTION

PATENT NO.        : 8,629,038 B2
APPLICATION NO.   : 13/344423
DATED             : January 14, 2014
INVENTOR(S)       : Ming-Chyi Liu Page 1 of 1

It is certified that error appears in the above-identified patent and that said Letters Patent is hereby corrected as shown below:

On the Title Page
Item (75) Inventor, delete "Hisn-Chu (TW)" and insert --Hsin-Chu (TW)--.
Item (57) Abstract, line 6, delete "material to from" and insert --material to form--.

In the Claims
In Col. 6, line 54, claim 1, delete "material to from" and insert --material to form--.
In Col. 7, line 41, claim 8, delete "material to from" and insert --material to form--.
In Col. 8, line 24, claim 14, delete "material to from" and insert --material to form--.

Signed and Sealed this
First Day of April, 2014

Michelle K. Lee
*Deputy Director of the United States Patent and Trademark Office*